United States Patent [19]
Lee et al.

[11] Patent Number: 6,077,730
[45] Date of Patent: Jun. 20, 2000

[54] METHOD OF FABRICATING THIN FILM TRANSISTORS

[75] Inventors: Sang-Gul Lee, Seoul; Ju-Cheon Yeo; Yong-Min Ha, both of Kyongki-do, all of Rep. of Korea

[73] Assignee: LG Electronics, Inc., Seoul, Rep. of Korea

[21] Appl. No.: 09/022,415

[22] Filed: Feb. 12, 1998

[30] Foreign Application Priority Data

May 23, 1997 [KR] Rep. of Korea ........................ 97-20281

[51] Int. Cl.[7] ........................ H01L 21/84; H01L 21/336
[52] U.S. Cl. ........................ 438/149; 438/307; 438/151
[58] Field of Search ........................ 438/149, 306, 438/307, 151, 154

[56] References Cited

U.S. PATENT DOCUMENTS

| 5,292,675 | 3/1994 | Codama . |
| 5,308,998 | 5/1994 | Yamazaki et al. . |
| 5,620,906 | 4/1997 | Yamaguchi et al. . |
| 5,864,151 | 1/1999 | Yamazaki et al. . |
| 5,888,858 | 3/1999 | Yamazaki et al. . |
| 5,904,509 | 5/1999 | Zhang et al. . |
| 5,923,961 | 7/1999 | Shibuya et al. . |
| 5,949,107 | 9/1999 | Zhang . |

FOREIGN PATENT DOCUMENTS

| 4-087340 | 3/1992 | Japan . |
| 6-260500 | 9/1994 | Japan . |
| 8-125196 | 5/1996 | Japan . |
| 9-293878 | 11/1997 | Japan . |

Primary Examiner—Charles Bowers
Assistant Examiner—Evan Pert
Attorney, Agent, or Firm—Morgan, Lewis & Bockius LLP

[57] ABSTRACT

A method is provided for fabricating a thin film transistor on a substrate. The method includes the steps of forming an active layer having a channel region on the substrate, forming an impurity-blocking mask covering the channel region and portions of the active layer outside the channel region adjacent the channel region, and doping impurities of a first conductivity type at a high density into portions of the active layer uncovered by the impurity-blocking mask to form impurity-doped regions in the active layer. The method further includes the steps of removing the impurity-blocking mask and thereafter performing a plasma treatment on the resultant structure using a plasma gas containing impurities of the first conductivity type to form LDD regions in the active layer between the channel region and the impurity-doped regions.

17 Claims, 6 Drawing Sheets

METHOD OF FABRICATING THIN FILM TRANSISTORS

BACKGROUND OF THE INVENTION

1. Field of the Invention

The present invention relates to a method of fabricating a thin film transistor, and more particularly, to a method of fabricating a thin film transistor having an LDD region in an active layer.

2. Discussion of the Related Art

Amorphous silicon (a-Si) thin film transistors (TFTs) have been mainly used for a liquid crystal display device. Polysilicon (poly-Si) TFT liquid crystal displays (LCDs), on the other hand, use polysilicon of a relatively high mobility as compared with amorphous silicon and have driving circuits formed on the same display panel instead of on separate driving circuits. The polysilicon TFT contains electrons and holes having higher mobilities than those of the amorphous TFT, and can be designed to embody a CMOS (complementary metal oxide silicon) structure. Therefore, instead of connecting the driving circuit ICs on the substrate, large parts of the driving circuit can be formed of TFTs together with TFTs for a pixel array of the display device. In addition, the polysilicon TFTs can be manufactured on a large-sized glass substrate, since recent development in crystallization techniques using a laser has made it possible to fabricate the polysilicon TFTs at a similar temperature to that for fabricating the amorphous TFTs.

As described above, a liquid crystal display using polysilicon TFTs has both a driving circuit part and a pixel part on the same glass substrate. Such polysilicon TFTs for the driving circuit part (referred to as "circuit TFTs") can perform high speed switching owing to their high performance, but polysilicon TFTs at the pixel array part (referred to as "pixel TFTs") may generate operational problems in the pixel array due to their high drain currents (off-currents) in their off states. To solve this problem, the polysilicon TFTs (especially for the pixel array) employ so-called lightly doped drain (LDD), offset, and/or dual gate structures.

FIGS. 1A–1F are cross-sectional views illustrating a process for fabricating a liquid crystal display having conventional thin film transistors. In each drawing, the left part indicates a pixel TFT and the right part shows circuit TFTs. The circuit TFTs include an n-type circuit TFT and a p-type circuit TFT that are electrically connected to each other to form a CMOS structure.

Figure 1A:
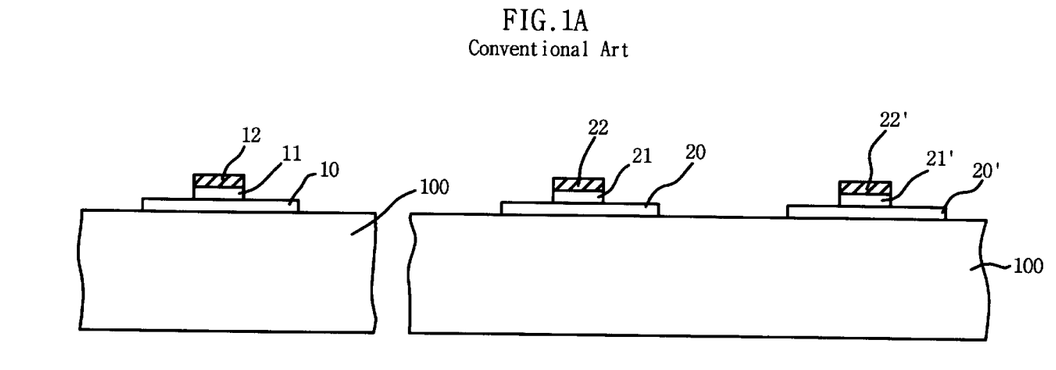
FIGS. 1A through 1F are cross-sectional views illustrating a process of fabricating a liquid crystal display having conventional thin film transistors.

Referring to FIG. 1A, a polysilicon layer is formed on an insulating substrate 100 and pattern-etched by a photolithographic process to form an active layer 10 for the pixel TFT, an active layer 20 for the n-type circuit TFT, and an active layer 20' for the p-type circuit TFT. In this process, the polysilicon layer is formed by depositing polycrystalline silicon, or by depositing an amorphous silicon layer on the substrate and subsequently crystallizing the amorphous silicon layer.

Next, an insulating layer and a metal layer are sequentially formed on the entire surface of the substrate. The metal layer is then pattern-etched by a photolithographic process to form a gate electrode 12 for the pixel TFT, a gate electrode 22 for the n-type circuit TFT, and a gate electrode 22' for the p-type circuit TFT. The insulating layer is pattern-etched by a photolithographic process using these gate electrodes 12, 22 and 22' as a mask to form a gate insulating layer 11 for the pixel TFT, a gate insulating layer 21 for the n-type circuit TFT, and a gate insulating layer 21' for the p-type circuit TFT. The insulating layer can be formed by depositing an insulating material, such as silicon oxide, silicon nitride, or the like using a plasma enhanced chemical vapor deposition (PECVD) technique. The metal layer can be formed by depositing aluminum or chrome using a sputtering method.

Figure 1B:
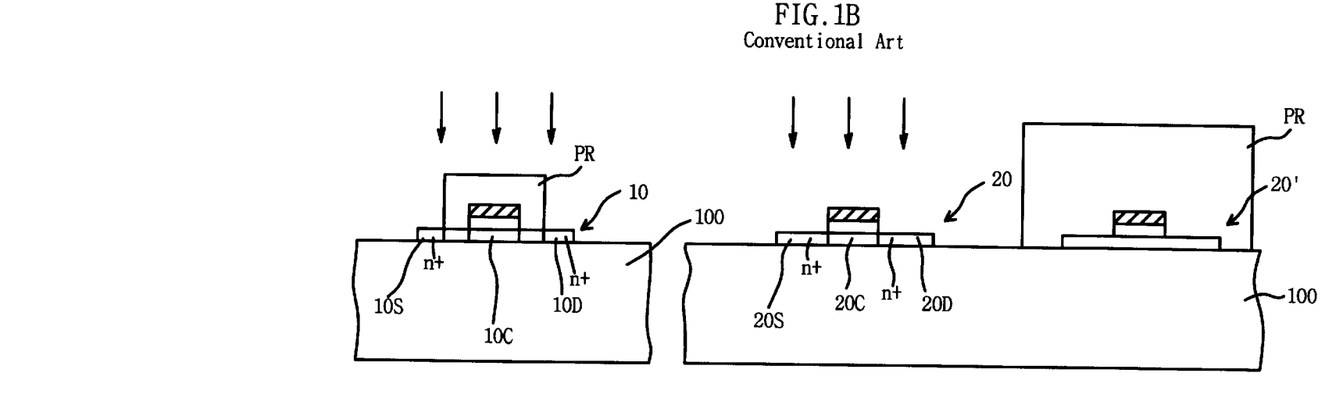

Referring to FIG. 1B, a photoresist is formed on the entire surface of the substrate, and a selective exposure and development process is carried out to form a photoresist pattern PR covering the entire surface of the active layer 20' of the p-type circuit TFT, the gate electrode 12, and a portion of the active layer 10 adjacent to the gate electrode 12 at the pixel TFT.

Impurity-doping using $n^+$-type impurities is then performed on the resultant structure to form source and drain regions 10S and 10D in the active layer 10 of the pixel TFT, and source and drain regions 20S and 20D in the active layer 20 of the n-type circuit TFT. Conventionally, $n^+$-type impurities (impurities for forming $n^+$ semiconductor regions) of about $10^{19-21}/cm^3$ are doped in this process. The photoresist patterns PR formed over the active layers 10 and 20 function as a mask for blocking the $n^+$-type impurities. As a result, portions of the active layer 10 of the pixel TFT between channel region 10C and the source and drain regions 10S and 10D remain undoped. In the active layer 20 for the n-type circuit TFT having no photoresist thereon, the source and drain regions 20S and 20D are formed in contact with the right and left sides of the channel region 20C.

Figure 1C:
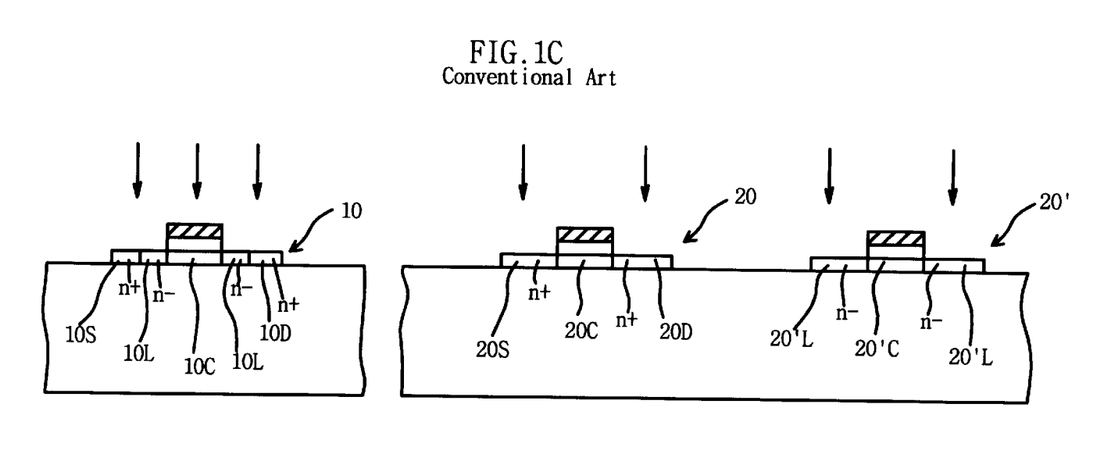

Referring to FIG. 1C, after the photoresist pattern is removed, impurity-doping using $n^-$-type impurities (impurities for forming $n^-$ semiconductor regions) is performed on the entire surface to form LDD regions 10L in the undoped region of the active layer 10 of the pixel electrode TFT. Conventionally, $n^-$-type impurities of $10^{15-18}/cm^3$ are doped. The source and drain regions 10S, 10D for the pixel TFT and the source and drain regions 20S, 20D for the n-type circuit TFT, as heavily doped with impurities, are not significantly affected by this light $n^-$-type impurity-doping. Both sides of channel region 20'C in the active layer 20' for the p-type circuit TFT are lightly doped with $n^-$ impurities to form lightly doped regions 20'L.

Figure 1D:
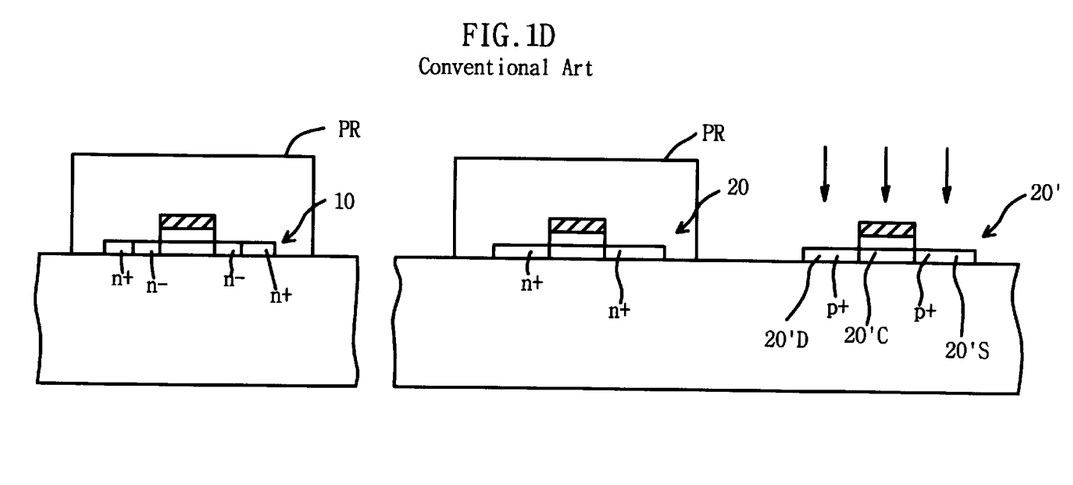

Referring to FIG. 1D, a photoresist layer is formed on the entire surface, and selective exposure and development are carried out to form a photoresist pattern PR covering the entire surface of the active layers 10 and 20.

Impurity-doping using $p^+$-type impurities (impurities for forming $p^+$ semiconductor regions) is then performed on the entire surface to form source and drain regions 20'S and 20'D in the active layer 20' of the p-type circuit TFT. Conventionally, $p^+$-type impurities of about $10^{19-21}/cm^3$ are doped. The photoresist pattern PR formed over the active layers 10 and 20 functions as a mask for blocking the $p^+$-type impurities. As a result, the source and drain regions 20'S and 20'D are formed only in the active layer 20' of the p-type circuit TFT. These regions 20'S and 20'D are in contact with the respective sides of the channel region 20C'. This type of doping: e.g., $n^-$-type impurities of about $10^{15-18}/cm^3$ doped and $p^+$-type impurities of about $10^{19-21}/cm^3$ subsequently doped into the same region of the active layer, is termed "counter doping method." The lightly doped $n^-$-type impurity region can be doped with $p^+$-type impurities so that the source and drain regions for the p-type circuit TFT are formed in the active layer with $p^+$ impurities dominant. The impurity regions formed in the respective active layers are activated by annealing the entire substrate by means of heat energy, such as laser irradiation.

Figure 1E:
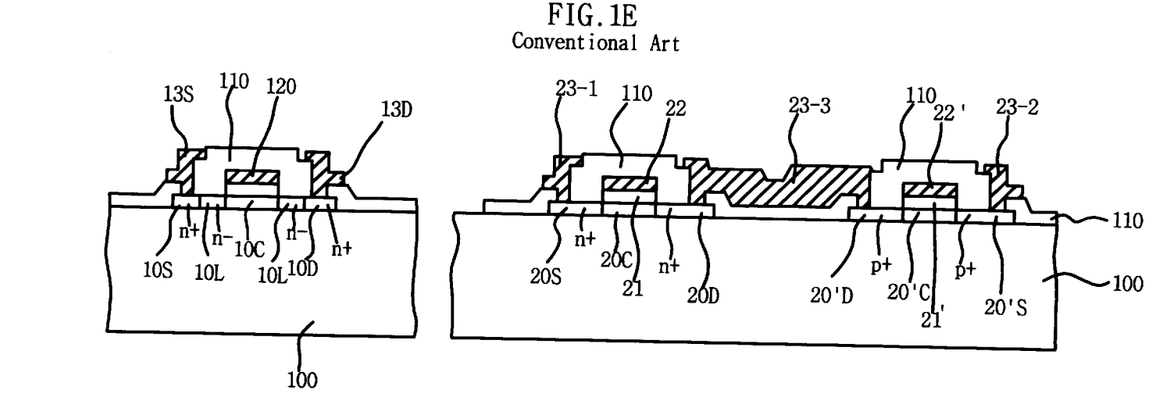

Referring to FIG. 1E, an insulating interlayer 110 is formed by depositing an insulating material on the entire surface, using a conventional PECVD method. The insulating interlayer 110 is then pattern-etched by a photolithographic process to form contact holes exposing the respective source and drain regions of the pixel TFT, n-type circuit TFT, and the p-type circuit TFT.

A metal layer including a metallic material such as aluminum, chrome, or the like, is formed over the entire surface and is pattern-etched by a photolithographic process to form metal patterns that are connected to the respective impurity regions. The metal patterns for circuit TFT complete a CMOS structure with the n-type circuit TFT and the p-type circuit TFT. The metal patterns include source and drain electrodes 13S and 13D connected to the source and drain regions 10S and 10D of the pixel TFT; a first metal pattern 23-1 connected to the source region 20S of the n-type circuit TFT; a second metal pattern 23-2 connected to the source region 20'S of the p-type circuit TFT; and a third metal pattern 23-3 connecting the drain region 20D of the n-type circuit TFT to the drain region 20'D of the p-type circuit TFT.

Figure 1F:
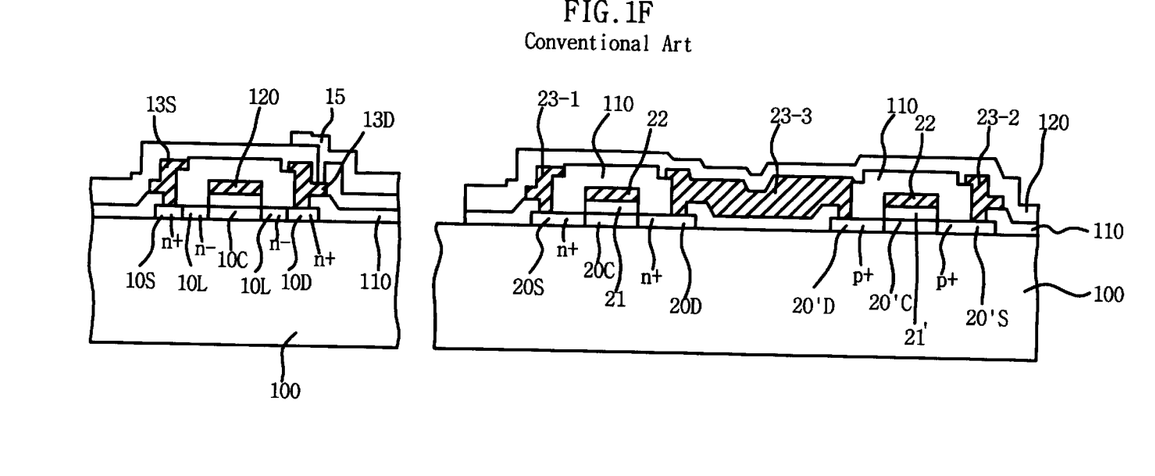

Referring to FIG. 1F, a protective layer 120 is formed by depositing an insulating layer on the entire surface. The protective layer is pattern-etched by a photolithographic process to form a contact hole exposing the drain electrode 13D of the pixel TFT. Then, a transparent conductive layer is formed on the entire surface and pattern-etched by a photolithographic process to form a pixel electrode 15 connected to the drain electrode 13D of the pixel TFT.

In the conventional thin film transistor above, the source and drain regions are formed by doping impurities having high energies into the active layer and silicon layer, and the LDD regions are also formed in the same manner. The doped impurities, having high energies, repeatedly collide with silicon atoms in the silicon layer, and stop at predetermined positions. This produces structural defects around the impurities' paths. In other words, the impurities doped into the active layer destroy the crystal structure of the silicon layer, forming many trap states in the silicon layer. These trap states capture and/or scatter carriers fed by the doped impurities, and interfere with carriers' movement. As a result, the switching characteristic of the resultant TFT may become poor and the reliability of the thin film transistor may be degraded.

SUMMARY OF THE INVENTION

Accordingly, the present invention is directed to a method of fabricating a thin film transistor that substantially obviates the problems due to limitations and disadvantages of the related art.

An object of the present invention is to provide a method of fabricating a thin film transistor that can reduce structural defects created in forming an impurity-doped layer, such as an LDD layer.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of fabricating a thin film transistor on a substrate, the method including the steps of forming an active layer having a channel region on the substrate; forming an impurity-blocking mask covering the channel region and portions of the active layer outside the channel region adjacent the channel region; doping impurities of a first conductivity type at a high density into portions of the active layer not covered by the impurity-blocking mask to form impurity-doped regions in the active layer; removing the impurity-blocking mask; and thereafter performing a plasma treatment over the substrate using a plasma gas containing impurities of the first conductivity type to form LDD regions in the active layer between the channel region and the impurity-doped regions.

In another aspect, the present invention provides a method of fabricating a thin film transistor on a substrate, the method including the steps of forming a patterned semiconductor layer on the substrate; depositing an insulating layer over the substrate including the semiconductor layer; depositing a conductive layer over the insulating layer; etching portions of the conductive layer to form a gate electrode overlapping the semiconductor layer, the overlapped portion of the semiconductor layer defining a channel region; etching portions of the insulating layer using the gate electrode as a mask to expose portions of the semiconductor layer at both sides of the gate electrode; forming an impurity blocking mask covering the gate electrode and portions of the exposed semiconductor layer that are adjacent the gate electrode; directing a high energy impurity-ion beam of a first conductivity type toward the substrate to implant impurities of the first conductivity type into portions of the semiconductor layer that remain uncovered by the impurity blocking mask, the impurity-implanted regions defining a source region and a drain region at both sides of the gate electrode; removing the impurity blocking mask; and performing a plasma treatment on the resultant substrate using impurities of the first conductivity type to form LDD regions in respective areas of the semiconductor layer between the channel region and the source and drain regions.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A–2F are cross-sectional views illustrating a process of fabricating a liquid crystal display having thin film transistors according to a preferred embodiment of the present invention. In each drawing, the left part shows a pixel TFT and the right part shows circuit TFTs. The circuit TFTs have a CMOS structure including an n-type circuit TFT and a p-type circuit TFT that are electrically connected to each other.

Figure 2A:
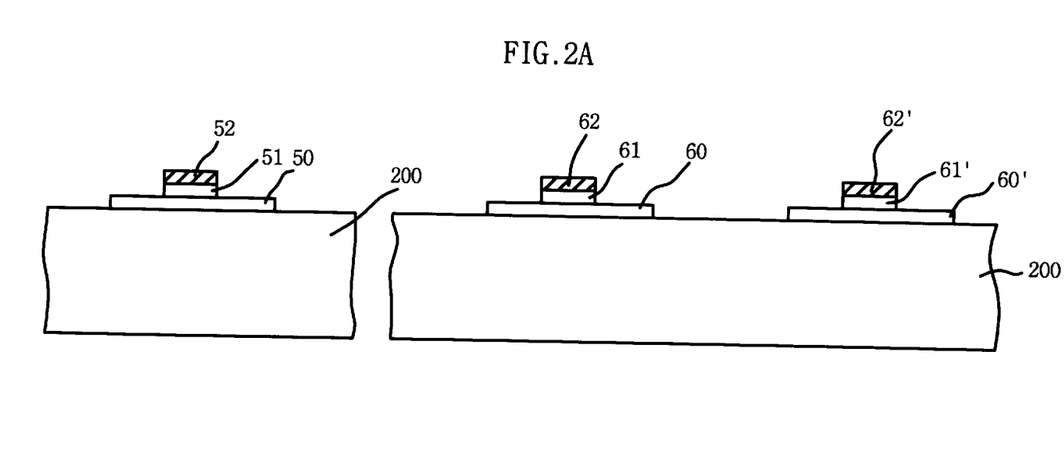
FIGS. 2A through 2F are cross-sectional views illustrating a process of fabricating a liquid crystal display having thin film transistors according to a preferred embodiment of the present invention.

Referring to FIG. 2A, a polysilicon layer is formed on an insulating substrate 200 and pattern-etched by a photolithographic process to form an active layer 50 for the pixel TFT, an active layer 60 for the n-type circuit TFT, and an active layer 60' for the p-type circuit TFT. In this process, the polysilicon layer may be formed by depositing polycrystalline silicon, or by depositing an amorphous silicon layer on the substrate and crystallizing the amorphous silicon layer, for example.

Next, an insulating layer and a conductive layer, such as a metal layer, is sequentially formed on the entire surface of the substrate. The conductive layer is then pattern-etched by a photolithographic process to form a gate electrode 52 for the pixel TFT, a gate electrode 62 for the n-type circuit TFT, and a gate electrode 62' for the p-type circuit TFT. The insulating layer is etched using these gate electrodes 52, 62, and 62' as a mask to form a gate insulating layer 51 for the pixel TFT, a gate insulating layer 61 for the n-type circuit TFT, and a gate insulating layer 61' for the p-type circuit TFT. The insulating layer may be formed by depositing an insulating material, such as oxide silicon, nitride silicon, or the like using a plasma enhanced chemical vapor deposition (PECVD) technique, for example. The conductive layer may be formed by depositing aluminum or chrome by a sputtering method, for example.

Figure 2B:
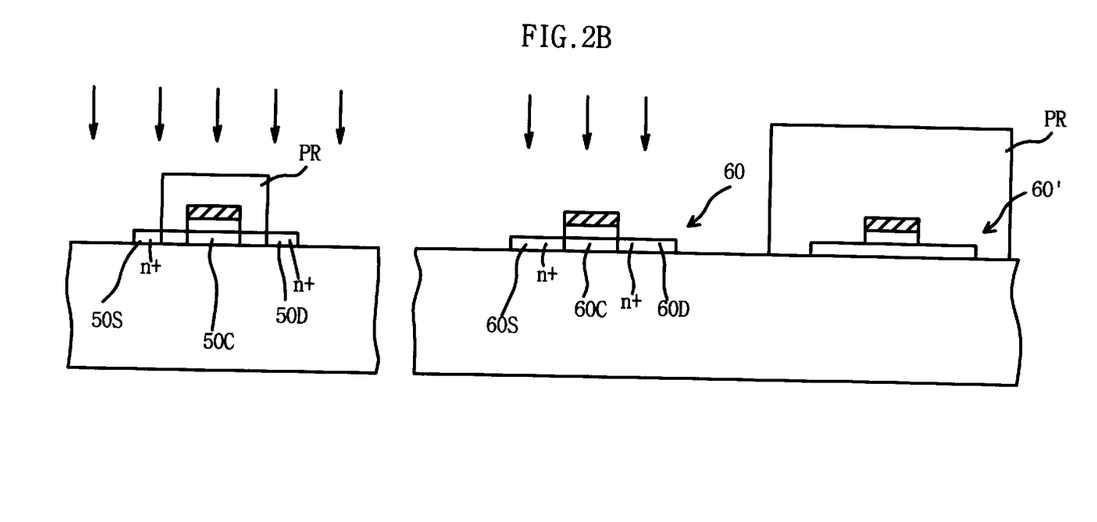

Referring to FIG. 2B, a photoresist is formed on the entire surface of the substrate, and selective exposure and development are carried out to form a photoresist pattern PR covering the entire surface of the active layer 60' of the p-type circuit TFT, the gate electrode 52, and portions of the active layer S0 adjacent to the gate electrode 52 of the pixel TFT.

An impurity-doping using $n^+$-type impurities is then performed on the entire surface to form source and drain regions 50S, 50D in the active layer S0 of the pixel TFT, and source and drain regions 60S, 60D in the active layer of the n-type circuit TFT. In this process, the $n^+$-type impurities of about $10^{19-21}/cm^3$ are doped. The photoresist pattern PR formed over the active layers 50 and 60' functions as a mask for blocking the $n^+$-type impurities. Therefore, undoped regions remain between the source region 50S and channel region 50C, and between the drain region 50D and the channel region 50C, in the active layer 50 of the pixel TFT. In the active layer 60 of the n-type circuit TFT having no photoresist thereon, the source and drain regions 60S, 60D are formed to be in contact with the right and left sides of the channel region 60C.

Figure 2C:
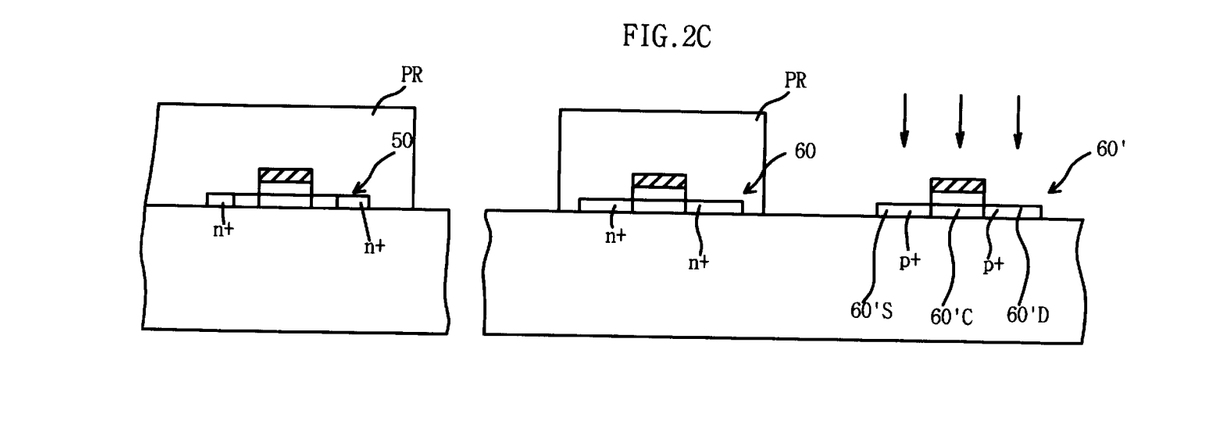

Referring to FIG. 2C, the photoresist pattern is removed, and another photoresist layer is formed on the entire substrate. Then, selective exposure and development are carried out to form a new photoresist pattern PR that covers the entire surfaces of the active layers 50 of the pixel TFT and the active layer 60 of the n-type circuit TFT.

Impurity-doping using $p^+$-type impurities is then performed on the entire surface of the resultant structure to form source and drain regions 60'S and 60'D in the active layer 60' of the p-type circuit TFT. Here, the $p^+$ impurities of about $10^{19-21}/cm^3$ are doped. The photoresist pattern PR formed on the active layers 50 and 60 functions as a mask for blocking the $p^+$-type impurities. Therefore, the source and drain regions 60'S and 60'D, which are in contact with the right and left sides of channel region 60'C, respectively, are formed only in the active layer 60' of the p-type circuit TFT.

Figure 2D:
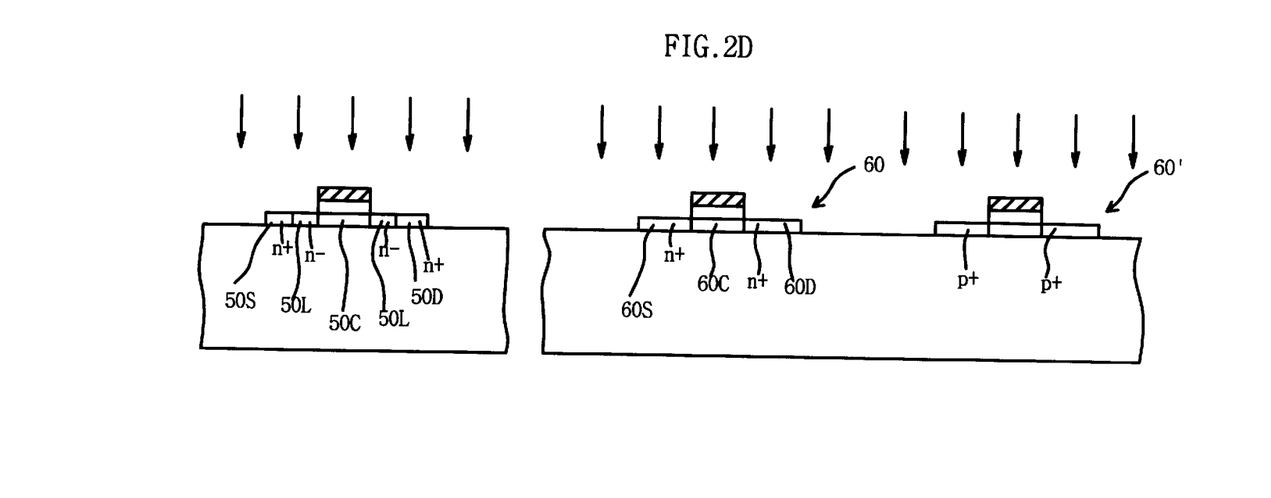

Referring to FIG. 2D, the photoresist layer is removed, and the entire surface of the substrate is treated with plasma formed by decomposing a mixed gas including $PH_3$ gas or P in a PECVD chamber.

For example, a mixed gas ($PH_3/H_3=1/99$) that is injected into a PECVD chamber at the pressure of 93 Pa, temperature of 240° C., RF power of 100 W, and duration of about 1 to 4 minutes will be decomposed into a plasma state. As a result, the substrate inserted into the PECVD chamber is exposed to the $PH_3$ plasma so that P of the $PH_3$ plasma is injected into the undoped region of the active layer 50 of the pixel TFT. A slight amount of P impurities are doped into the active layer using their own energies to form LDD regions 50L. Since P in the $PH_3$ plasma can be doped into the active layer with their own small energy, the crystalline structure of the active layer will be much less damaged, as compared with the conventional impurity doping method described above. The source and drain regions 50S, 50D of the pixel TFT and the other source and drain regions 60S, 60D, 60'S, 60'D, are not significantly affected by the $PH_3$ plasma treatment, since they are doped with impurities having a high concentration.

Figure 2E:
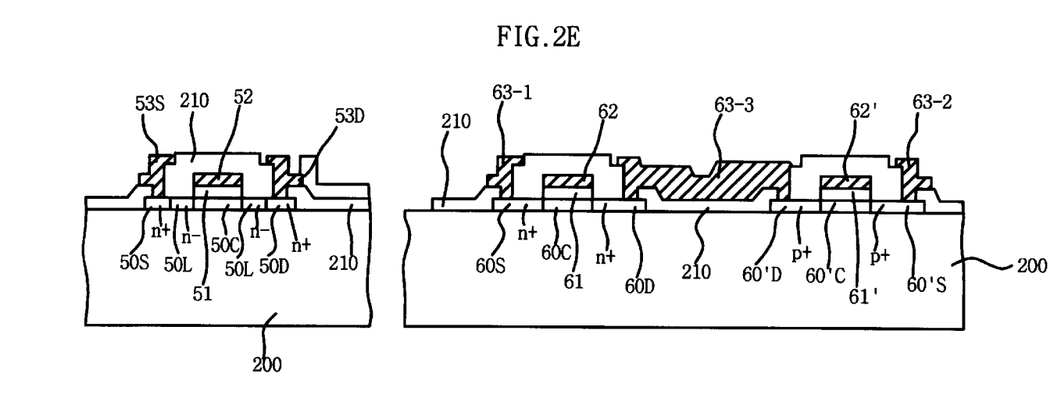

Referring to 2E, an insulating interlayer 210 is formed by depositing an insulating material on the entire surface by a PECVD method using the same PECVD system as in the above plasma treatment of the substrate for forming the LDD regions 50L. Unlike the conventional art, the chamber does not need to be replaced during the process, and thus, the substrate is not exposed to atmosphere outside the chamber. As a result, the substrate is not contaminated by particles or dust, and the resultant devices have higher reliability and stable performance. The LDD regions 50L and the insulating interlayer 210 can be formed in the same PECVD chamber, or in a multi-chamber system where a PECVD chamber for forming the LDD layer 50L is connected to another PECVD chamber for forming the insulating interlayer 210 without breaking vacuum.

Next, the insulating interlayer 210 is pattern-etched by a photolithographic process to form contact holes exposing the respective source and drain regions of the pixel TFT, n-type circuit TFT, and the p-type circuit TFT.

A metal layer including a metallic material, such as aluminum, chrome, or the like, is formed on the entire surface, and etched by a photolithographic process to form metal patterns that are connected to the respective impurity regions. The metal patterns for circuit TFTs complete a CMOS structure by connecting the n-type circuit TFT and the p-type circuit TFT. Source and drain electrodes 53S and 53D are connected to the source and drain regions 50S and 50D of the pixel TFT, respectively. A first metal pattern 63-1 is connected to the source region 60S of the n-type circuit TFT. A second metal pattern 63-2 is connected to the source region 60'S of the p-type circuit TFT. A third metal pattern 63-3 connects the drain region 60D of the n-type circuit TFT to the drain region 60'D of the p-type circuit TFT.

Figure 2F:
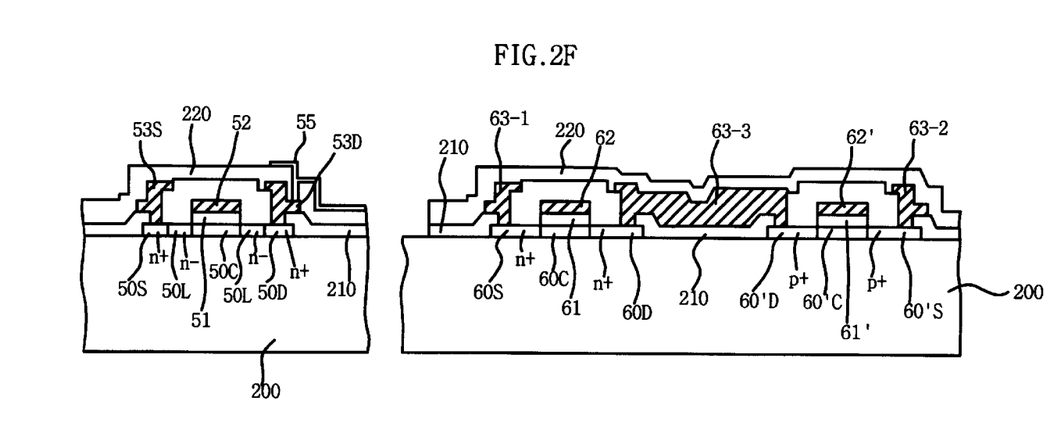

Referring to FIG. 2F, a protective layer 220 is formed by depositing an insulating layer on the entire surface and is etched to form a contact hole exposing the drain electrode 53D of the pixel TFT. Then, a transparent conductive layer is formed on the entire surface and pattern-etched by a photolithographic process to form a pixel electrode 55 connected to the drain electrode 53D of the pixel TFT.

In the above embodiment of the present invention, the pixel TFT is formed by doping n-type impurities and the LDD regions are formed by using the $PH_3$ plasma. Alternatively, the pixel TFT having p-type LDD TFT can also be formed with p-type impurities based on the same principles. When a plasma treatment with a mixed gas including $BH_3$ or B is performed, $p^-$-type impurity regions can be formed in the active layer.

As described above, the LDD region is formed in the active layer using plasma having small energy to prevent the crystal structure in the silicon layer from being damaged by high energy impurity-doping. Thus, the trap states that capture and scatter the carriers of the silicon layer can be reduced, and resultant thin film transistors yield excellent switching characteristics. Also, since the LDD region and the insulating interlayer may be formed in the same chamber, additional equipment is not required and the process is simplified, thereby enhancing the production yields.

It will be apparent to those skilled in the art that various modifications and variations can be made in the method of fabricating a thin film transistor according to the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor on a substrate, the method comprising the steps of:

forming an active layer having a channel region on the substrate;

forming an impurity-blocking mask covering the channel region and portions of the active layer outside the channel region adjacent the channel region;

doping impurities of a first conductivity type at a high density into portions of the active layer not covered by the impurity-blocking mask to form impurity-doped regions in the active layer;

removing the impurity-blocking mask; and thereafter performing a plasma treatment on the substrate using a plasma gas containing impurities of the first conductivity type to form LDD regions in the active layer between the channel region and the impurity-doped regions.

2. The method according to claim 1, wherein the step of performing the plasma treatment includes the step of decomposing a mixed gas having at least one of $PH_3$ and P.

3. The method according to claim 1, wherein the step of performing the plasma treatment includes the step of decomposing a mixed gas having at least one of $BH_3$ and B.

4. The method according to claim 1, further comprising the steps of:

forming an insulating interlayer over the active layer including the impurity-doped regions and the LDD regions therein;

forming contact holes in the insulating interlayer, the contact holes exposing portions of the impurity-doped regions;

forming a metal layer over the insulating interlayer; and pattern-etching the metal layer to form a source electrode connected to one of the impurity-doped regions and a drain electrode connected to another one of the impurity-doped regions.

5. The method according to claim 4, wherein the step of performing the plasma treatment and the step of forming the insulating interlayer are carried out in a plasma enhanced chemical vapor deposition (PECVD) system.

6. The method according to claim 5, wherein the step of performing the plasma treatment and the step of forming the insulating interlayer are carried out in a same chamber of the PECVD system.

7. The method according to claim 5, wherein the step of performing the plasma treatment includes the step of performing the plasma treatment in one of multi-PECVD chambers, and the step of forming the insulating interlayer includes the steps of transferring the resultant substrate to another one of the multi-PECVD chambers without breaking vacuum and forming the insulating interlayer in the another one of the multi PECVD chambers.

8. A method of fabricating a thin film transistor on a substrate, the method comprising the steps of:

forming a patterned semiconductor layer on the substrate;

depositing an insulating layer over the substrate including the semiconductor layer;

depositing a conductive layer over the insulating layer;

etching portions of the conductive layer to form a gate electrode overlapping the semiconductor layer, the overlapped portion of the semiconductor layer defining a channel region;

etching portions of the insulating layer using the gate electrode as a mask to expose portions of the semiconductor layer at both sides of the gate electrode;

forming an impurity blocking mask covering the gate electrode and portions of the exposed semiconductor layer that are adjacent the gate electrode;

directing a high energy impurity-ion beam of a first conductive type toward the substrate to implant impurities of the first conductive type into portions of the semiconductor layer that remain uncovered by the impurity blocking mask, the impurity-implanted regions defining a source region and a drain region at both sides of the gate electrode;

removing the impurity blocking mask; and performing a plasma treatment on the resultant substrate using impurities of the first conductive type to form LDD regions in respective areas of the semiconductor layer between the channel region and the source and drain regions.

9. The method according to claim 8, further comprising the steps of:

forming an insulating layer over substrate after the step of performing the plasma treatment;

removing portions of the insulating layer to form contact holes respectively exposing the source and drain regions;

forming a metal layer over the insulating layer; and patterning the metal layer to form a source electrode in contact with the source region and a drain electrode in contact with the drain region through the respective contact holes.

10. The method according to claim 9, wherein the step of performing the plasma treatment and the step of forming the insulating interlayer are carried out in a plasma enhanced chemical vapor deposition (PECVD) system.

11. The method according to claim 10, wherein the step of performing the plasma treatment and the step of forming the insulating interlayer are carried out in a same chamber of the PECVD system.

12. The method according to claim 10, wherein the step of performing the plasma treatment includes the step of performing the plasma treatment in one of multi-PECVD chambers, and the step of forming insulating interlayer includes the steps of transferring the substrate to another one of the multi-PECVD chambers without breaking vacuum and forming the insulating layer in the another one of the multi PECVD chambers.

13. The method according to claim 8, wherein the step of forming the patterned semiconductor layer includes the step of depositing a polysilicon layer on the substrate.

14. The method according to claim 8, wherein the step of forming the patterned semiconductor layer includes the steps of depositing an amorphous silicon layer on the substrate and annealing the amorphous silicon layer to transform the amorphous silicon layer into a polysilicon layer.

15. The method according to claim 8, wherein the step of directing includes the step of implanting the impurities of the first conductive type into the portions of the semiconductor layer to form the source and drain regions of a first impurity density, and the step of performing the plasma treatment includes the step of exposing the substrate to a plasma gas including the impurities of the first conductive type to form the LDD region of a second impurity density less than the first impurity density of the source and drain regions.

16. The method according to claim 15, wherein the step of directing includes the step of implanting impurities including phosphorus into the portions of the semiconductor layer to form the source and drain regions having an impurity density of about $10^{20}$ to $10^{21}$ cm$^{-3}$, and the step of performing the plasma treatment includes the step of exposing the substrate to a plasma gas including phosphorus to form the LDD region having an impurity density less than that of the source and drain regions.

17. The method according to claim 15, wherein the step of directing includes the step of implanting impurities including boron into the portions of the semiconductor layer to form the source and drain regions having an impurity density of about $10^{19}$ to $10^{21}$ cm$^{-3}$, and the step of performing the plasma treatment includes the step of exposing the substrate to a plasma gas including boron to form the LDD region having an impurity density less than that of the source and drain regions.

* * * * *